United States Patent
Shibahara et al.

(10) Patent No.: US 6,963,156 B2
(45) Date of Patent: Nov. 8, 2005

(54) SURFACE ACOUSTIC WAVE DEVICE AND COMMUNICATION DEVICE INCORPORATING SAME

(75) Inventors: Teruhisa Shibahara, Kanazawa (JP); Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 81 days.

(21) Appl. No.: 10/410,851

(22) Filed: Apr. 10, 2003

(65) Prior Publication Data
US 2004/0251776 A1 Dec. 16, 2004

(30) Foreign Application Priority Data
Apr. 10, 2002 (JP) .............................. 2002-108025

(51) Int. Cl.[7] .................. H03H 9/145; H03H 9/64; H01L 41/00
(52) U.S. Cl. ............... 310/313 D; 310/313 A; 310/313 B; 310/313 R; 333/193; 333/194; 333/195
(58) Field of Search ............... 310/313 R, 313 B, 310/313 D; 333/193–195

(56) References Cited

U.S. PATENT DOCUMENTS

| 4,425,554 A | * | 1/1984 | Morishita et al. | ........... 333/195 |
|---|---|---|---|---|
| 6,037,847 A | * | 3/2000 | Ueda et al. | .................. 333/193 |
| 6,353,372 B1 | * | 3/2002 | Baier et al. | .................. 333/195 |
| 6,759,928 B2 | * | 7/2004 | Endou et al. | ................ 333/193 |
| 2002/0079988 A1 | * | 6/2002 | Endou et al. | ................ 333/193 |
| 2002/0121842 A1 | * | 9/2002 | Takamine | ............... 310/313 B |

FOREIGN PATENT DOCUMENTS

| EP | 1 221 769 A1 | 7/2002 | .......... H03H 4/145 |
|---|---|---|---|
| WO | WO 02/03549 A1 | 1/2002 | .......... H03H 9/145 |

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

In a surface acoustic wave device in which balanced terminals extend from series IDTs, noise coming from an electrical-potential signal at the series connection point of the series IDTs is removed to improve the degree of balance. A surface acoustic wave filter includes a pair of surface acoustic wave reflectors disposed on a piezoelectric substrate along the propagation direction of surface acoustic waves, and a plurality of IDTs disposed between the two surface acoustic wave reflectors. Two opposing electrode fingers of the IDTs, which are series IDTs, are connected to corresponding balanced terminals, and the series connection point thereof is grounded. As a result, noise coming from an abnormal electrical-potential signal generated at the series connection point is removed to improve the degree of balance between the balanced terminals.

14 Claims, 13 Drawing Sheets

SURFACE ACOUSTIC WAVE DEVICE AND COMMUNICATION DEVICE INCORPORATING SAME

BACKGROUND OF THE INVENTION

1. Field of the Invention

The present invention relates to surface acoustic wave devices and, more particularly, to a surface acoustic wave device having a balanced-to-unbalanced conversion function, and to a communication device incorporating the surface acoustic wave device.

2. Description of the Related Art

In recent years, cellular phones have become remarkably smaller and lighter. In order to realize such smaller and lighter cellular phones, a smaller size of cellular phone components and components in which a plurality of functions are integrated have been developed. Against a background of such circumstances, research has been extensively performed on a surface acoustic wave filter having a balanced-to-unbalanced conversion function, which is commonly called a balun, used in the RF stage of a cellular phone, and these have begun to be put into practical use. Several patent applications for such surface acoustic wave filters having a balanced-to-unbalanced conversion function (hereinafter referred to as "surface acoustic wave filters with a balanced-to-unbalanced conversion function") have been filed.

Depending on the system configuration of a cellular phone, there are cases in which a surface acoustic wave filter with a balanced-to-unbalanced conversion function, having an impedance of a balanced terminal which is approximately four times as high as the impedance of an unbalanced terminal, is required. Examples of surface acoustic wave filters meeting such a demand include a surface acoustic wave filter, in which the terminals of IDTs which are connected in series (hereinafter referred to simply as "series IDTs"), disposed along a direction that is perpendicular to the propagation direction of surface acoustic waves, are formed as balanced terminals. For example, in an unexamined patent publication "Japanese Unexamined Patent Application Publication No. 2001-292050 (Publication Date: Oct. 19, 2001)", a surface acoustic wave filter in which terminals of series IDTs are formed as balanced terminals is disclosed.

FIG. 14 shows a surface acoustic wave filter 100 as a conventional example in which terminals of series IDTs are formed as balanced terminals. In FIG. 14, a conductor thin-film pattern formed on a piezoelectric substrate (not shown) is indicated by hatching.

In the surface acoustic wave filter 100, surface acoustic wave reflectors 101 and 102 formed such that a plurality of conductor thin-film fine lines are arranged in parallel are disposed with a spacing therebetween, and IDTs (Interdigital Transducers) 103, 104, 105, and 106 are arranged between the surface acoustic wave reflectors 101 and 102.

The IDT 103 is disposed adjacent to the surface acoustic wave reflector 101, and the IDT 106 is disposed adjacent to the surface acoustic wave reflector 102. One of the terminals of the IDT 103 is grounded, and the other terminal is connected to an unbalanced terminal 107. In a similar manner, one of the terminals of the IDT 106 is grounded, and the other terminal is connected to the unbalanced terminal 107.

The IDT 104 and the IDT 105 are arranged so as to be sandwiched between the IDT 103 and the IDT 106. Furthermore, the IDTs 104 and 105 are arranged so as to be arranged to define upper and lower portions so as to approximately divide the width of the propagation path of the surface acoustic waves into two portions. The adjacent terminals of the IDTs 104 and 105 are integrally provided as a common electrode 108. Furthermore, the terminals on the side which is not of the common electrode 108 of the IDT 104 are connected to a balanced terminal 109. In a similar manner, the terminal on the side which is not of the common electrode 108 of the IDT 105 is a balanced terminal 110. That is, the IDT 104 and the IDT 105 are series IDTs, and the common electrode 108 is a series connection point thereof.

In the surface acoustic wave filter 100, when an alternating signal is input to the unbalanced terminal 107, surface acoustic waves are emitted from the IDT 103 and the IDT 106, thereby generating standing surface acoustic waves between the surface acoustic wave reflector 101 and the surface acoustic wave reflector 102. Next, the IDTs 104 and 105 absorb the surface acoustic waves from these waves, and generates an electrical signal. Since each of the IDTs 104 and 105 converts approximately half of the surface acoustic waves in the vertical direction into electrical signals, the amplitudes of the electrical signals generated by them nearly match each other. Furthermore, since the polarity of the balanced terminal 109 connected to the IDT 104 is opposite to the polarity of the balanced terminal 110 to which the IDT 105 is connected, the phases of the electrical signals generated in them differ by approximately 180°.

Based on the above-described operating principles, in the surface acoustic wave filter 100, when an alternating signal is input from the unbalanced terminal 107, a balanced output having an approximately opposite phase and the same amplitude is output from the balanced terminal 109 and the balanced terminal 110. Furthermore, since the efficiency of the electrical signal-to-surface acoustic wave conversion, performed in the IDTs 103 to 106, has a frequency characteristic, a frequency filter characteristic is obtained between the unbalanced terminal 107 and the balanced terminals 109 and 110. This is the same characteristic as that seen in general surface acoustic wave devices.

The surface acoustic wave filter 100 performs an operation which is opposite to the foregoing when the unbalanced terminal 107 is an output terminal, and the balanced terminals 109 and 110 are input terminals.

Here, in the surface acoustic wave filter with a balanced-to-unbalanced conversion function, the degree of balance, that is, when an alternating signal is input to unbalanced terminals, by how much the amplitudes of the alternating signals output from the two balanced terminals are aligned (hereinafter referred to as a "degree of amplitude balance"), and by how much the difference of the phases of the alternating signals output from the two balanced terminals is close to 180° (hereinafter referred to as a "degree of phase balance"), become important characteristic indicators.

However, the surface acoustic wave filter with a balanced-to-unbalanced conversion function of the above-described conventional configuration has a problem in that the degree of balance is not sufficient for the surface acoustic wave filter to be incorporated in a cellular phone, and therefore, further improvements are needed.

In this respect, as one of the reasons that the degree of balance cannot be obtained sufficiently, noise which comes from an electrical-potential signal generated at the series connection point of series IDTs can be given. Specifically, in an ideal operating state, an electrical-potential signal will not be generated at the series connection point of series IDTs, but in practice, several electrical-potential signals are generated. Thus, the electrical-potential signals which are generated at the series connection point cause noise to occur in the two balanced terminals via a parasitic capacitor, etc. At this time, the phase of the noise generated in one of the balanced terminals and the phase of the noise generated in the other balanced terminal are not always in an inverted relationship. As a result, this noise causes the degree of balance of the balanced terminals to be worsened.

SUMMARY OF THE INVENTION

In order to overcome the problems described above, preferred embodiments of the present invention provide a surface acoustic wave device, in which balanced terminals extend from series IDTs, which is capable of removing noise coming from an electrical-potential signal at the series connection point of the series IDTs in order to improve the degree of balance, and a communication device incorporating the surface acoustic wave device.

According to a preferred embodiment of the present invention, a surface acoustic wave device includes a pair of surface acoustic wave reflectors disposed on a piezoelectric substrate along the propagation direction of surface acoustic waves, and a plurality of comb-shaped electrode sections arranged between the two surface acoustic wave reflectors, wherein a first comb-shaped electrode section, which is one of the plurality of comb-shaped electrode sections, has two opposing electrode fingers thereof connected to corresponding balanced terminals, divided portions of the first comb-shaped electrode section, which are divided in a direction that is substantially perpendicular to the propagation direction of surface acoustic waves, are connected to each other, and the connection point of the divided portions is grounded.

According to the above-described configuration, the surface acoustic wave device has balanced terminals that extend from series IDTs (first comb-shaped electrode section) which are disposed in an arrayed manner along a direction that is substantially perpendicular to the propagation direction of surface acoustic waves (that is, divided in a commonly called cross-width direction) and which are connected in series. In the surface acoustic wave device, the connection point of the series IDTs (series connection point) is grounded.

Therefore, it becomes possible to remove an abnormal electrical-potential signal which is generated at the series connection point of the series IDTs. As a result, noise coming from an abnormal electrical signal generated at the series connection point can be removed from the balanced terminals in order to improve the degree of amplitude balance and the degree of phase balance between the balanced terminals. The electrical-potential signal which is generated at the series connection point of the series IDTs is an abnormal electrical-potential signal, which is not generated in an ideal operating state. Therefore, even if this abnormal electrical-potential signal is removed, no adverse influence is exerted on the characteristics of the surface acoustic wave device at all.

In the surface acoustic wave device of preferred embodiments of the present invention, preferably, electrode fingers which are electrically connected with the connection point of the first comb-shaped electrode section are grounded.

According to the above-described configuration, in addition, the grounding of the series connection point of the series IDTs may be performed via an electrode finger by grounding that electrode finger which electrically conducts with the series connection point.

In the manner described above, if the grounding of the series connection point of the series IDTs is performed via an electrode finger which electrically conducts with that series connection point, since a conductor thin-film line on a piezoelectric substrate, which communicates to the series connection point, can be used, no influence is exerted on the propagation path of the surface acoustic waves. That is, unlike the configuration in which bump bonding or wire bonding is performed at the series connection point in order to perform grounding from outside the piezoelectric substrate, the configuration is such that the series connection point does not block a large area in the propagation path of the surface acoustic waves. Therefore, loss in the surface acoustic waves does not occur, and no adverse influence is exerted on the characteristics of the surface acoustic wave device.

In the surface acoustic wave device of preferred embodiments of the present invention, in a second comb-shaped electrode section, other than the first comb-shaped electrode section, among the plurality of comb-shaped electrode sections, one of two opposing electrode fingers may be connected to an unbalanced terminal, and the other electrode finger may be grounded.

According to the above-described configuration, in addition, a surface acoustic wave filter with a balanced-to-unbalanced conversion function, in which balanced terminals extend from series-connected series IDTs (first comb-shaped electrode section), can be realized.

In the surface acoustic wave device of preferred embodiments of the present invention, the connection point of the first comb-shaped electrode section may be electrically connected with the grounded electrode finger of the second comb-shaped electrode section.

According to the above-described configuration, in addition, the grounding of the series connection point of the series IDTs can be performed by making an electrical connection with the grounded electrode finger of the IDT adjacent to the series IDTs.

In the manner described above, if the grounding of the series connection point of the series IDTs is performed via the grounded electrode finger of the adjacent IDT, since a conductor thin-film line on the piezoelectric substrate can be used, no influence is exerted on the propagation path of the surface acoustic waves. That is, unlike the configuration in which bump bonding or wire bonding is performed at the series connection point in order to perform grounding from outside the piezoelectric substrate, the configuration is formed such that the series connection point does not block a large area in the propagation path of the surface acoustic waves. Therefore, loss in the surface acoustic waves does not occur, and no adverse influence is exerted on the characteristics of the surface acoustic wave device.

In the surface acoustic wave device of preferred embodiments of the present invention, the one first comb-shaped electrode section may be arranged between two of the second comb-shaped electrode sections.

The communication device of preferred embodiments of the present invention incorporates the above-described surface acoustic wave device.

According to the above-described configuration, in the communication device incorporating a surface acoustic wave filter with a balanced-to-unbalanced conversion function, that surface acoustic wave device has an improved degree of amplitude balance and an improved degree of phase balance between balanced terminals since the series connection point of the series IDTs is grounded. Therefore, by incorporating such a surface acoustic wave device, a communication device, such as a cellular phone, having superior filter characteristics, can be realized.

Other features, elements, characteristics and advantages of the present invention will become more apparent from the following detailed description of preferred embodimnents thereof with reference to the attached figures.

DETAILED DESCRIPTION OF PREFERRED EMBODIMENTS

Preferred embodiments of the present invention will now be described below with reference to FIG. 1.

Figure 1:
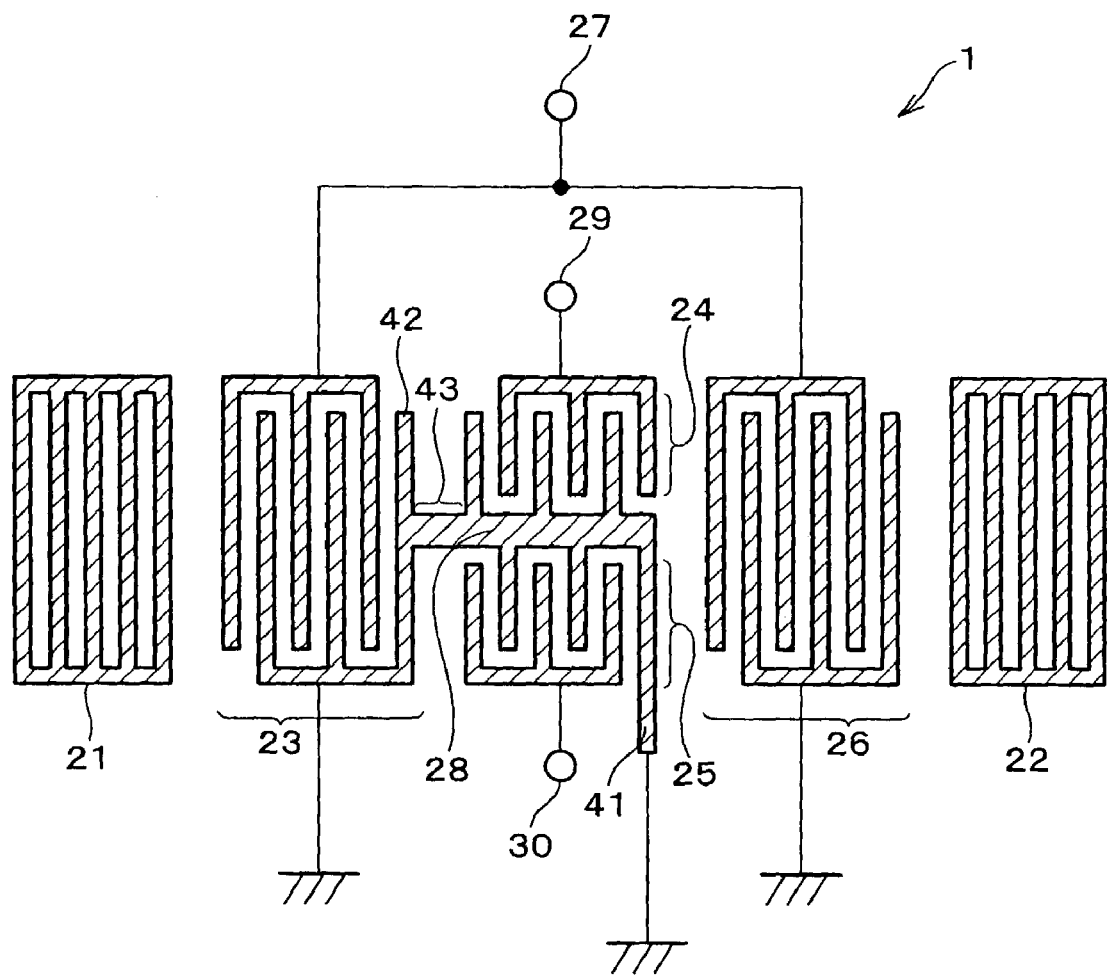
FIG. 1 is a schematic plan view showing the overall configuration of a surface acoustic wave filter according to a preferred embodiment of the present invention.

As shown in FIG. 1, a surface acoustic wave filter (surface acoustic wave device) 1 according to the present preferred embodiment is a surface acoustic wave filter with a balanced-to-unbalanced conversion function, having a plurality of IDTs (Interdigital Transducers) (comb-shaped electrode sections, hereinafter referred to as "IDTs") disposed on a piezoelectric substrate (not shown) along the propagation direction of surface acoustic waves, and is particularly configured in such a manner that balanced terminals extend from series IDTs (IDTs which are connected in series so as to be disposed along a direction that is substantially perpendicular to the propagation direction of surface acoustic waves).

Then, in the surface acoustic wave filter 1, in order to improve the degree of amplitude balance and the degree of phase balance, a common electrode 28, which is at a series connection point of series IDTs from which balanced terminals 29 and 30 extend, is grounded. Specifically, on the side of one of the adjacent IDTs 26 of the common electrode 28, an electrode finger 41 functioning also as a grounding line, which extends outside a propagation path of surface acoustic waves, is formed, and the end portion thereof is grounded. Furthermore, on the side of the other adjacent IDT 23 of the common electrode 28, a connection line 43 which extends to the grounded electric finger 42 of the IDT 23 is formed, and the common electrode 28 is grounded via the connection line 43 and the electrode finger 42.

In the manner described above, in the surface acoustic wave filter with a balanced-to-unbalanced conversion function, in which balanced terminals 29 and 30 are made to extend from IDTs which are disposed along the direction that is substantially perpendicular to the propagation direction of surface acoustic waves (that is, divided in a commonly called cross-width direction) and which are connected in series (series IDTs), by grounding the series connection point (common electrode 28) of the series IDTs, an abnormal electrical-potential signal which is generated at this series connection point can be removed. As a result, noise coming from the abnormal electrical-potential signal which is generated at the series connection point is removed from the balanced terminals 29 and 30, and thus the degree of balance between the balanced terminals 29 and 30 is improved. Specifically, the degree of balance which is sufficient for incorporation in a cellular phone can be achieved.

Here, to begin with, during an ideal operating state, an electrical-potential signal is not generated at the series connection point of the series IDTs. That is, the electrical-potential signal generated at the series connection point is an abnormal electrical-potential signal. Therefore, even if this abnormal electrical-potential signal is removed by grounding, no adverse influence is exerted at all on the characteristics of the surface acoustic wave filter.

For the advantages that are actually obtained by grounding the series connection point of the series IDTs, data is shown in the preferred embodiments (to be described later).

Next, as methods for grounding the series connection point (common electrode 28) of the series IDTs, two methods are possible: a method of performing bump bonding or wire bonding at the series connection point in order to perform grounding from outside a piezoelectric substrate; and a method of grounding via a conductor thin-film line on a piezoelectric substrate, which communicates through to the series connection point.

When the former method is used, it is necessary to increase the size of the series connection point by a certain degree, and the series connection point blocks a large area in the propagation path of the surface acoustic waves, causing a loss in the surface acoustic waves to occur. Therefore, filter characteristics are adversely affected. Consequently, as a method of grounding the series connection point of the series IDTs, the latter method of grounding via a conductor thin-film line on a piezoelectric substrate is preferable.

Furthermore, even in the latter method, a method of grounding a series connection point by grounding an electrode finger (electrode finger 41 serving also as a grounding line) connected to the series connection point (common electrode 28) among the electrode fingers of the series IDTs, and a method of grounding a series connection point by causing the grounded electrode finger (electrode finger 42) of the IDT (IDT 23) adjacent to the series IDTs to conduct with the series connection point make it possible to ground the series connection point without exerting any influence on the propagation path of the surface acoustic waves, and thus these are particularly preferable.

In the surface acoustic wave filter 1, the series connection point (common electrode 28) of the series IDTs is grounded via the electrode finger 41 functioning also as a grounding line, and is also grounded via the adjacent IDT 23. That is, in the surface acoustic wave filter 1, both end portions of the common electrode 28 along the propagation direction of surface acoustic waves are grounded. In this manner, by being grounded at a plurality of places, the grounding resistance is decreased, and the electrical potential of the connection point is more stabilized at a grounding electrical potential. As a result, the advantage that an abnormal electrical-potential signal generated at the series connection point is removed, and thus the degree of balance between the balanced terminals 29 and 30 is improved, becomes bigger.

As described above, in the surface acoustic wave filter 1, since the series connection point is grounded by using a conductor thin-film line on the piezoelectric substrate, which communicates through to the series connection point, even if this grounding is performed, the surface acoustic wave device does not become enlarged, and the cost is also not increased.

This preferred embodiment does not limit the scope of the present invention, and various modifications are possible within the scope of the present invention. For example, the configuration may be arranged as described below.

The surface acoustic wave device of preferred embodiments of the present invention is a surface acoustic wave device having a balanced-to-unbalanced conversion function, which has a plurality of IDTs disposed along the propagation direction of surface acoustic waves on a piezoelectric substrate and in which balanced terminals are made to extend from the series-connected IDTs disposed in a direction that is substantially perpendicular to the propagation direction of surface acoustic waves, wherein the series connection point of the series-connected IDTs is grounded.

Furthermore, in the surface acoustic wave device, by grounding an electrode finger, which electrically conducts with the series connection point, among the electrode fingers of the series-connected IDTs, the series connection point may be grounded.

Furthermore, in the surface acoustic wave device, by causing the grounded electrode finger of the IDT adjacent to the series-connected IDTs to conduct with the series connection point, the series connection point may be grounded.

First to eleventh preferred embodiments of the present invention will now be described below with reference to FIGS. 1 to 13.

First Preferred Embodiment

FIG. 1 shows a surface acoustic wave filter (surface acoustic wave device) 1 according to the first preferred embodiment of the present invention. In FIG. 1, a conductor thin-film pattern disposed on a piezoelectric substrate (not shown) is shown by hatching.

Figure 14:
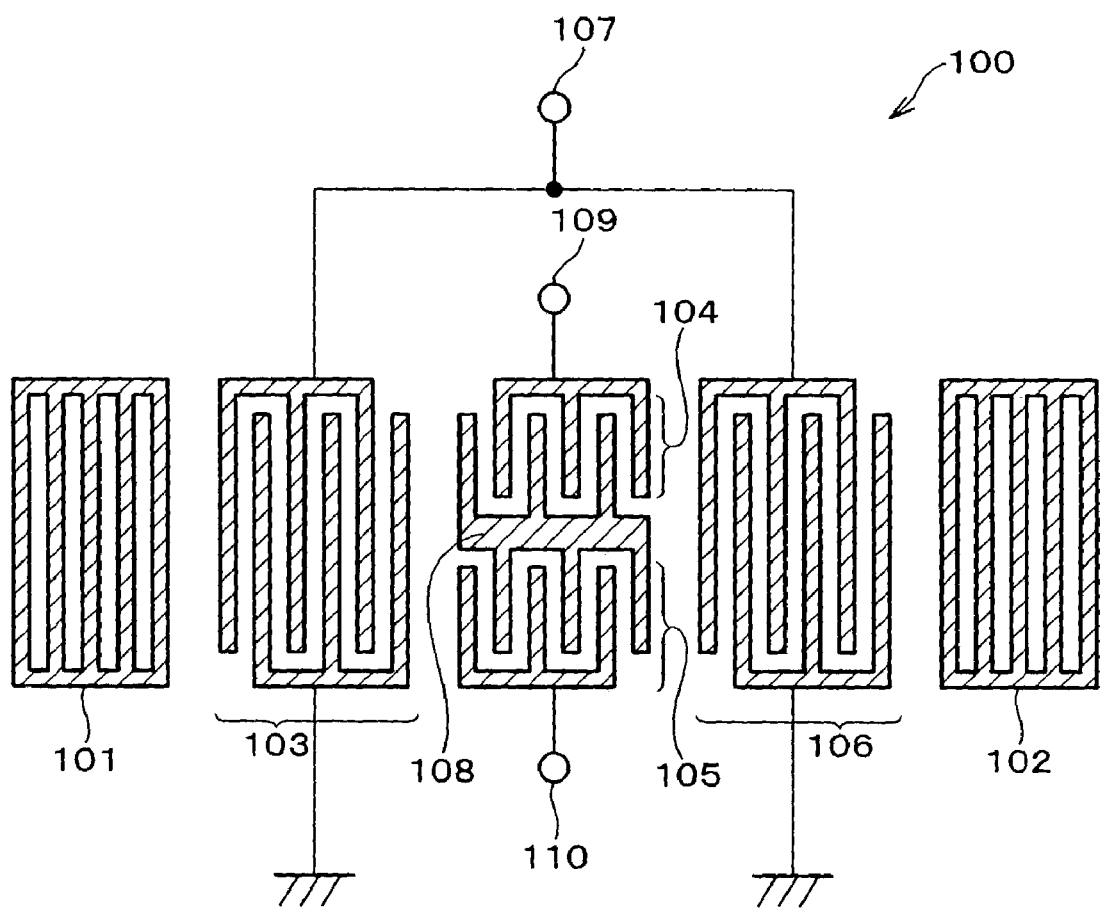
FIG. 14 is a schematic plan view showing the overall configuration of a surface-acoustic-wave filter according to a conventional example.

As shown in FIG. 1, the surface acoustic wave filter 1 is a surface acoustic wave filter in which terminals of series IDTs define balanced terminals. Most parts of the surface acoustic wave filter 1 are configured in the same manner as the surface acoustic wave filter 100 (FIG. 14), which is a conventional example. The differences are that the electrode finger 41 functioning also as a grounding line, connected to the common electrode 28, is grounded and that the common electrode 28 conducts with the grounded electrode finger 42 of the IDT 23 via the connection line 43.

Specifically, in the surface acoustic wave filter 1, surface acoustic wave reflectors 21 and 22 arranged in such a manner that a plurality of conductor thin-film fine lines are arrayed in parallel are arranged with a spacing therebetween, and IDTs (Interdigital Transducers) 23, 24, 25, and 26 are arranged between the surface acoustic wave reflector 21 and the surface acoustic wave reflector 22.

The IDT 23 (second comb-shaped electrode section) is disposed adjacent to the surface acoustic wave reflector 21, and the IDT 26 (second comb-shaped electrode section) is disposed adjacent to the surface acoustic wave reflector 22. One of the terminals of the IDT 23 is grounded, and the other terminal is connected to the unbalanced terminal 27. In a similar manner, one of the terminals of the IDT 26 is grounded, and the other terminal is connected to the unbalanced terminal 27.

The IDTs (first comb-shaped electrode sections) 24 and 25 are disposed in such a manner so as to be sandwiched between the IDT 23 and the IDT 26. Furthermore, the IDTs 24 and 25 are disposed in such a manner as to be arrayed vertically so as to approximately divide the width of the propagation path of the surface acoustic waves into two portions. Then, the terminals of the IDTs 24 and 25 are integrally provided as the common electrode (connection point) 28. Furthermore, the terminal on the side which is not of the common electrode 28 of the IDT 24 is connected to the balanced terminal 29. In a similar manner, the terminal on the side which is not of the common electrode 28 of the IDT 25 is connected to a balanced terminal 30. That is, the IDTs 24 and 25 are series IDTs, and the common electrode 28 is the series connection point thereof.

Here, in particular, in the surface acoustic wave filter 1, an electrode finger 41 functioning also as a grounding line, connected to the common electrode 28, is grounded. Furthermore, the common electrode 28 conducts with the grounded electrode finger 42 of the IDT 23 via the connection line 43.

Next, specific design parameters in the surface acoustic wave filter 1 are shown below. However, the design parameters disclosed below are only examples, and the scope of the present invention is not limited to these examples.

The piezoelectric substrate is preferably a 40±5° rotated Y-cut X-propagation $LiTiO_3$ substrate. The conductor thin-film is preferably an aluminum thin-film, and its thickness is, for example, approximately 180 nm. The surface acoustic wave reflectors 21 and 22 have a pitch of about 1.09 $\mu$m and a metallization ratio of about 0.57, and the number of electrode fingers is 116. The IDT 23 and 26 have a pitch of about 1.08 $\mu$m, a metallization ratio of about 0.63, and a cross width of about 155 $\mu$m, and the number of electrode fingers is 26. The IDT 24 and 25 have a pitch of about 1.08 $\mu$m, a metallization ratio of about 0.63, and a cross width of about 70 $\mu$m, and the number of electrode fingers is 42.

The operation of the surface acoustic wave filter 1 will now be described below. In the surface acoustic wave filter 1, when an alternating signal is input to the unbalanced terminal 27, surface acoustic waves are emitted from the IDT 23 and the IDT 26, thereby generating standing surface acoustic waves between the surface acoustic wave reflector 21 and the surface acoustic wave reflector 22. Then, the IDTs 24 and 25 absorb the surface acoustic waves from these waves, and generates an electrical signal. Since each of the IDTs 24 and 25 converts approximately half of the surface acoustic waves in the vertical direction into electrical signals, the amplitudes of the electrical signals generated by them nearly match each other. Furthermore, since the polarity of the balanced terminal 29 connected to the IDT 24 is opposite to the polarity of the balanced terminal 30 to which the IDT 25 is connected, the phases of the electrical signals generated in them differ by approximately 180°.

Based on the above operating principles, in the surface acoustic wave filter 1, when an alternating signal is input from the unbalanced terminal 27, a balanced output having an approximately opposite phase and the same amplitude is output from the balanced terminal 29 and the balanced terminal 30. Furthermore, since the efficiency of the electrical signal-to-surface acoustic wave conversion, performed in the IDTs 23 to 26, has a frequency characteristic, a frequency filter characteristic is obtained between the unbalanced terminal 27 and the balanced terminals 29 and 30. This is the same as that seen in general surface acoustic wave devices.

The operation in a case where the unbalanced terminal 27 is an input terminal and the balanced terminals 29 and 30 are output terminals has been described. However, conversely, when the unbalanced terminal 27 is an output terminal and the balanced terminals 29 and 30 are input terminals, an opposite operation is performed. This is clear from the reciprocal theorem which holds true in general linear passive circuits.

As described above, in the surface acoustic wave filter 1, the common electrode 28 is grounded via the electrode finger 41 functioning also as a grounding line, the connection line 43, and the electrode finger 42 of the IDT 23, and the electrical potential thereof is fixed at the grounding potential.

As a result, noise coming from the signal generated in the common electrode 28 is eliminated from the balanced terminals 29 and 30, and thus the degree of amplitude balance and the degree of phase balance of the outputs generated in the balanced terminals 29 and 30 are improved.

Figure 2:
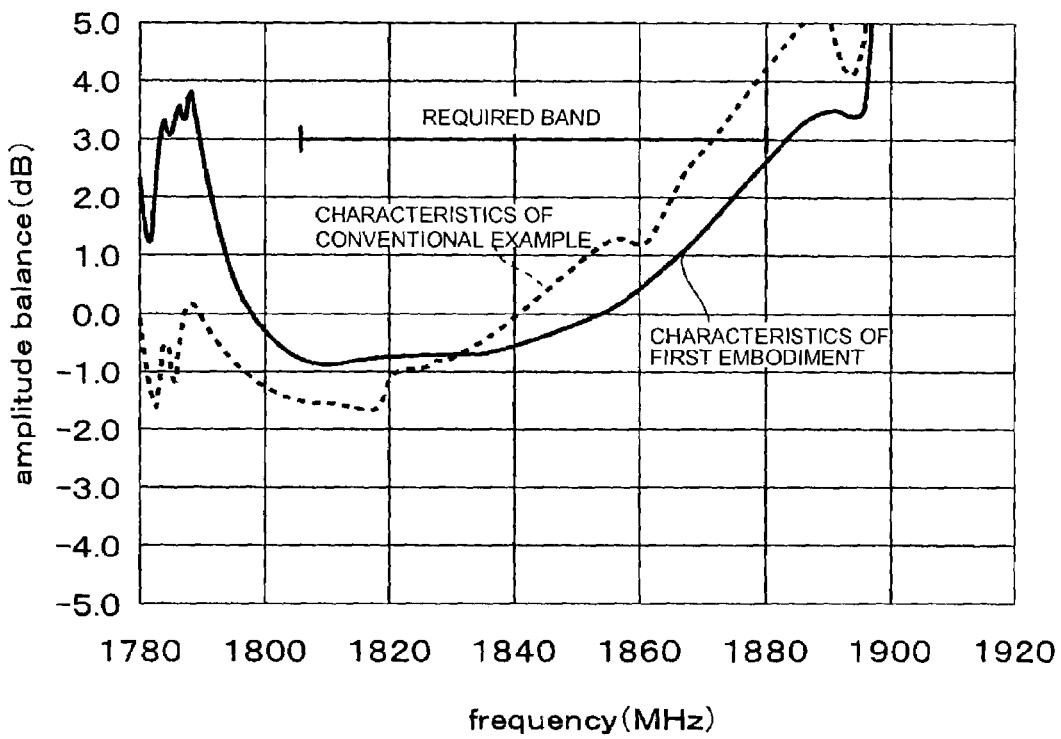
FIG. 2 is a graph in which the degree of amplitude balance of the surface acoustic wave filter according to the preferred embodiment shown in FIG. 1, and the degree of amplitude balance of a surface acoustic wave filter according to a conventional example shown in FIG. 14 are compared.

FIG. 2 is a graph in which the degree of amplitude balance of the surface acoustic wave filter 1 in which the common electrode 28 is grounded, and the degree of amplitude balance of the surface acoustic wave filter 100 (FIG. 14), in which the common electrode 108 is not grounded, according to the conventional example are compared. In FIG. 2, as the indicator of the degree of amplitude balance, the ratio, displayed in decibels, of amplitudes of the alternating signals generated in the two balanced output terminals, is plotted in the horizontal axis. Therefore, the closer to 0 dB this value is, the better the degree of amplitude balance is.

As can be seen from FIG. 2, in the surface acoustic wave filter 1, the degree of amplitude balance is improved by approximately 1.0 dB more than that of the surface acoustic wave filter 100 of the conventional example in the required band.

Figure 3:
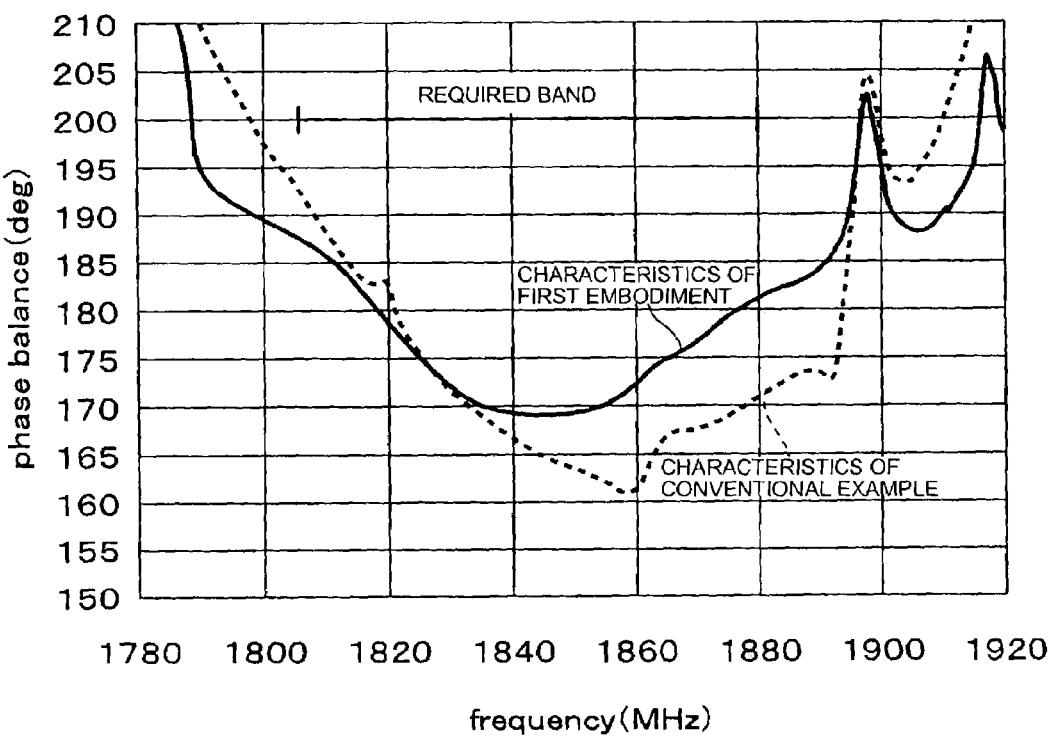
FIG. 3 is a graph in which the degree of phase balance of the surface acoustic wave filter according to the preferred embodiment shown in FIG. 1, and the degree of phase balance of the surface acoustic wave filter according to the conventional example shown in FIG. 14 are compared.

FIG. 3 is a graph in which the degree of phase balance of the surface acoustic wave filter 1, and the degree of phase balance of the surface acoustic wave filter 100 are compared. In FIG. 3, as the indicator of the degree of phase balance, the difference of phases of the alternating signals generated in the two balanced output terminals is plotted in the vertical axis. Therefore, the closer to 180° this value is, the better the degree of phase balance is.

As can be seen from FIG. 3, in the surface acoustic wave filter 1, the degree of phase balance is improved by about 5° to about 10° more than that of the surface acoustic wave filter 100 of the conventional example in the required band.

In the manner described above, since the electrical potential of the common electrode 28 which is at the series connection point of the series IDTs is fixed at the grounding potential, both the degree of amplitude balance and the degree of phase balance are improved, and thus the degree of balance is improved comprehensively. Therefore, by removing noise coming from the electrical-potential signal at the series connection point of the series IDTs, the degree of balance of the surface acoustic wave filter with a balanced-to-unbalanced conversion function, of a configuration in which balanced terminals are made to extend from the series IDTs can be improved.

Second Preferred Embodiment

Figure 4:
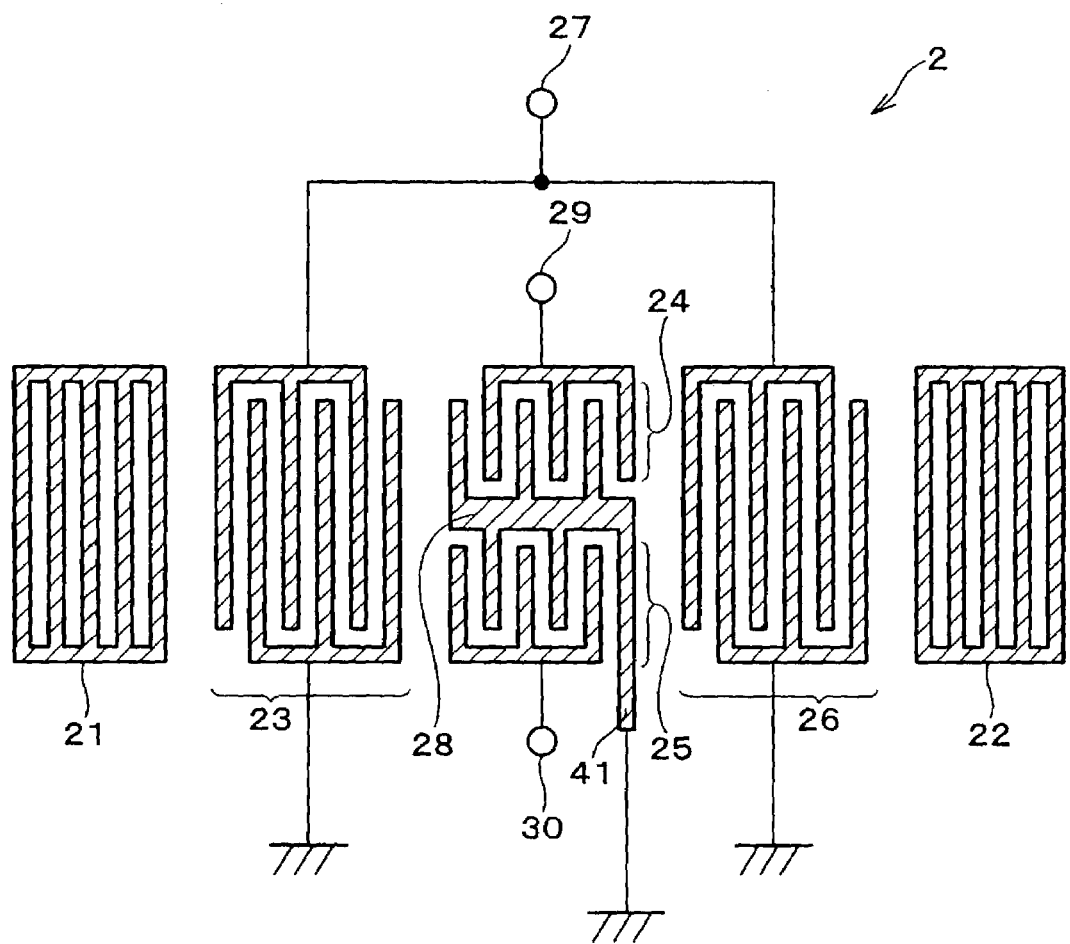
FIG. 4 is a schematic plan view showing the overall configuration of a surface acoustic wave filter according to another preferred embodiment of the present invention.

FIG. 4 shows a surface acoustic wave filter (surface acoustic wave device) 2 according to the second preferred embodiment of the present invention.

As shown in FIG. 4, the surface acoustic wave filter 2 differs from the surface acoustic wave filter 1 of the first preferred embodiment (FIG. 1) in that the connection line 43 is not provided and the common electrode 28 is grounded via only the electrode finger 41 functioning also as a grounding line.

In this manner, the advantage can be obtained by only the fact that, for the grounding path of the series connection point (common electrode 28) of the series IDTs, there is only one of the electrode finger 41 functioning also as a grounding line and the connection line 43. The case in which there is only one grounding path is included in the scope of the present invention.

Third Preferred Embodiment

Figure 5:
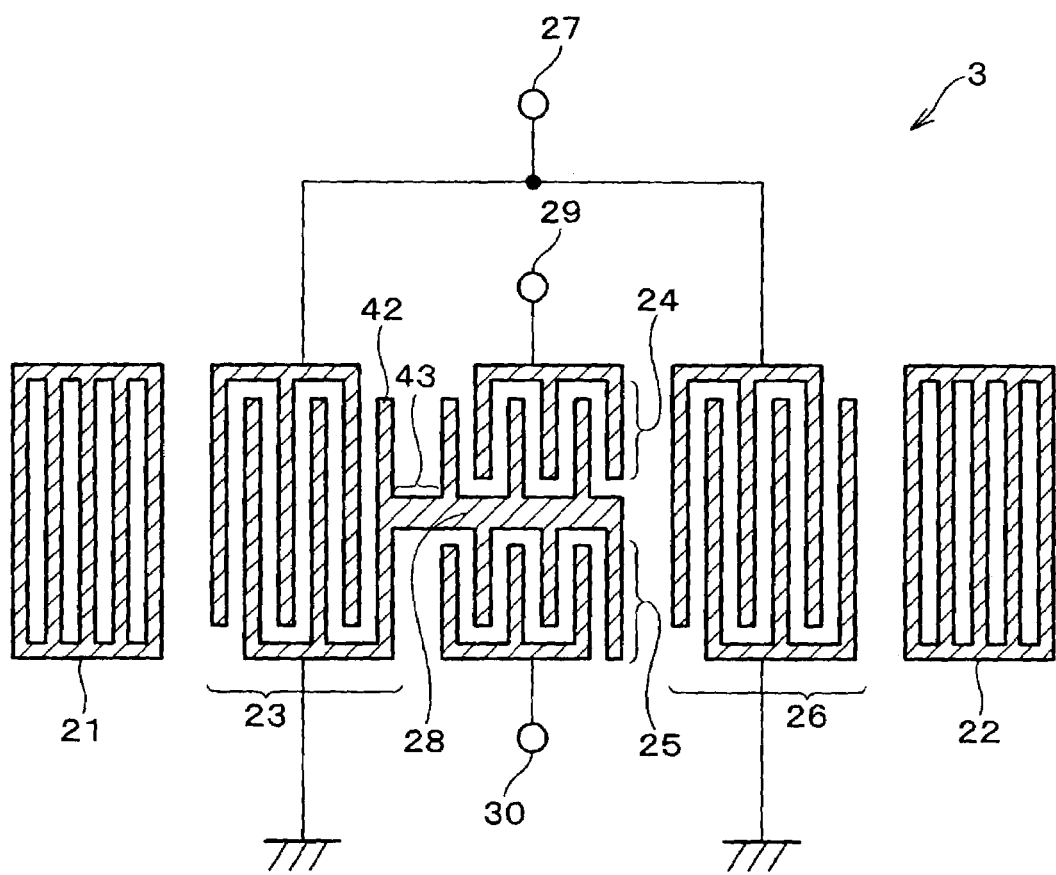
FIG. 5 is a schematic plan view showing the overall configuration of a surface acoustic wave filter according to another preferred embodiment of the present invention.

FIG. 5 shows a surface acoustic wave filter (surface acoustic wave device) 3 according to the third preferred embodiment of the present invention.

As shown in FIG. 5, the surface acoustic wave filter 3 differs from the surface acoustic wave filter 1 of the first preferred embodiment (FIG. 1) in that the electrode finger 41 functioning also as a grounding line is not provided and the common electrode 28 is grounded via only the connection line 43.

In the surface acoustic wave filter 3, an electrode finger corresponding to the electrode finger 41 functioning also as a grounding line of FIG. 1 is provided only within the propagation path of the surface acoustic waves in the same manner as in the other electrode fingers.

Fourth Preferred Embodiment

Figure 6:
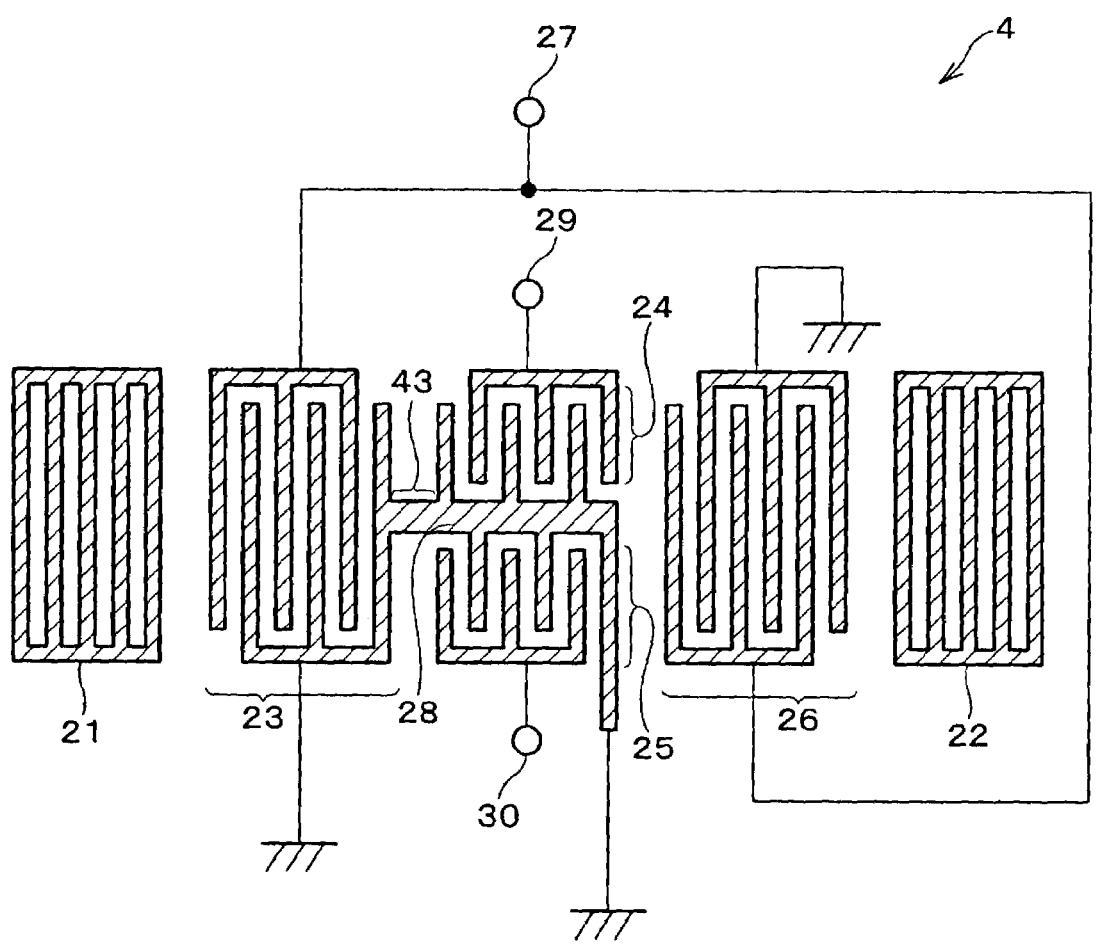
FIG. 6 is a schematic plan view showing the overall configuration of a surface acoustic wave filter according to another preferred embodiment of the present invention.

FIG. 6 shows a surface acoustic wave filter (surface acoustic wave device) 4 according to the fourth preferred embodiment of the present invention.

As shown in FIG. 6, the surface acoustic wave filter 4 differs from the surface acoustic wave filter 1 of the first preferred embodiment (FIG. 1) in that the polarity of the IDT 26 is inverted.

Fifth Preferred Embodiment

Figure 7:
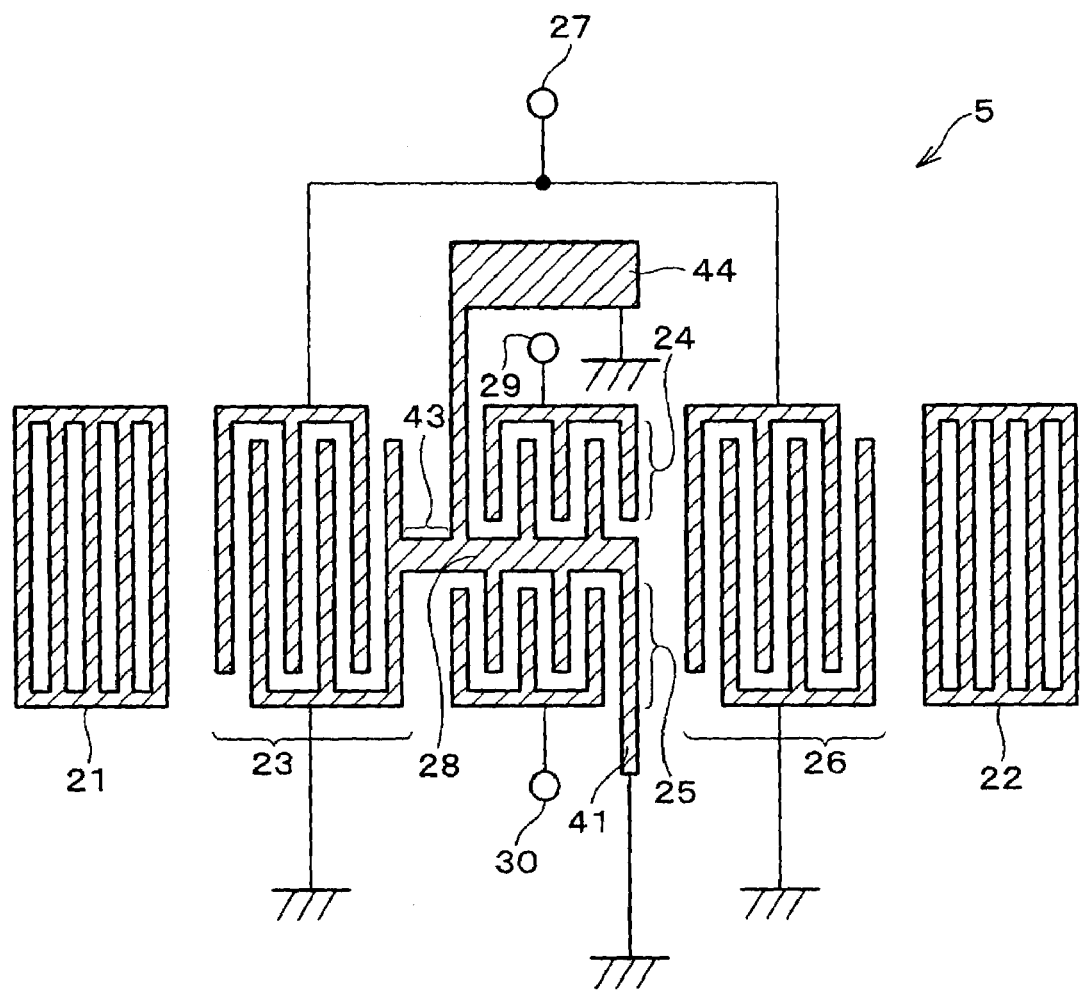
FIG. 7 is a schematic plan view showing the overall configuration of a surface acoustic wave filter according to another preferred embodiment of the present invention.

FIG. 7 shows a surface acoustic wave filter (surface acoustic wave device) 5 according to the fifth preferred embodiment of the present invention.

As shown in FIG. 7, the surface acoustic wave filter 5 differs from the surface acoustic wave filter 1 of the first preferred embodiment (FIG. 1) in that a grounding line 44 which extends outside the propagation path of the surface acoustic waves is disposed in the end portion opposite to the end portion where the electrode finger 41 functioning also as a grounding line of the common electrode 28 is formed, and that opposite end portion is grounded. Unlike the electrode finger 41 functioning also as a grounding line, the grounding line 44 has line portions with a large area in the area outside the propagation path of the surface acoustic waves.

Sixth Preferred Embodiment

Figure 8:
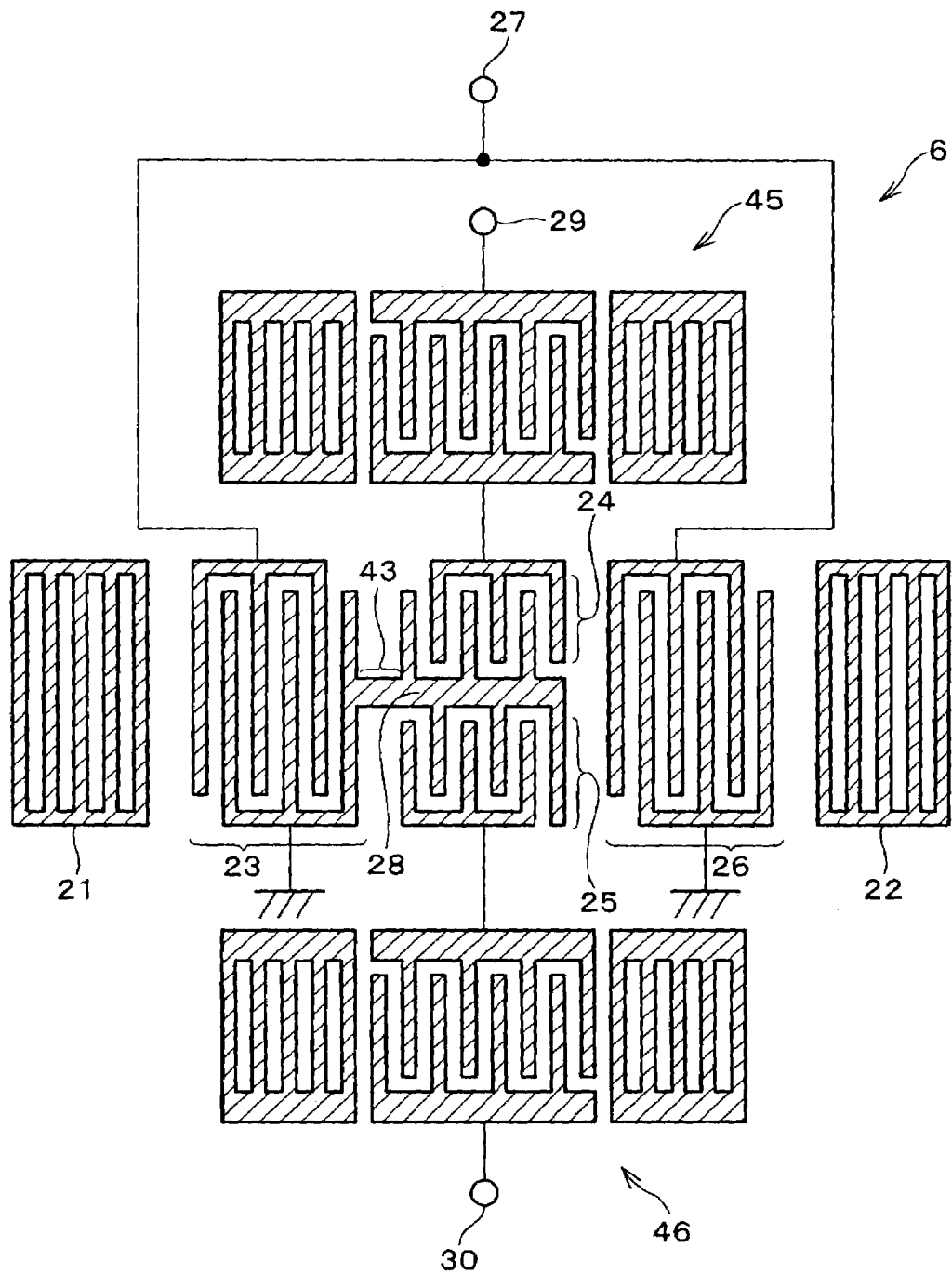
FIG. 8 is a schematic plan view showing the overall configuration of a surface acoustic wave filter according to another preferred embodiment of the present invention.

FIG. 8 shows a surface acoustic wave filter (surface acoustic wave device) 6 according to the sixth preferred embodiment of the present invention.

As shown in FIG. 8, in the surface acoustic wave filter 6, a surface acoustic wave resonator 45 is disposed between the IDT 24 of the surface acoustic wave filter 3 (FIG. 5) described in the third preferred embodiment and the balanced terminal 29, and a surface acoustic wave resonator 46 is disposed between the IDT 25 and the balanced terminal 30. Each of the surface acoustic wave resonators 45 and 46 includes reflectors on both sides of the IDT, with one of the terminals of the IDT being grounded, and the other terminal being connected to the balanced terminal 29 or 30.

The case in which the surface acoustic wave device is combined with a surface acoustic wave reflector and another surface acoustic wave filter is included in the scope of the present invention.

Seventh Preferred Embodiment

Figure 9:
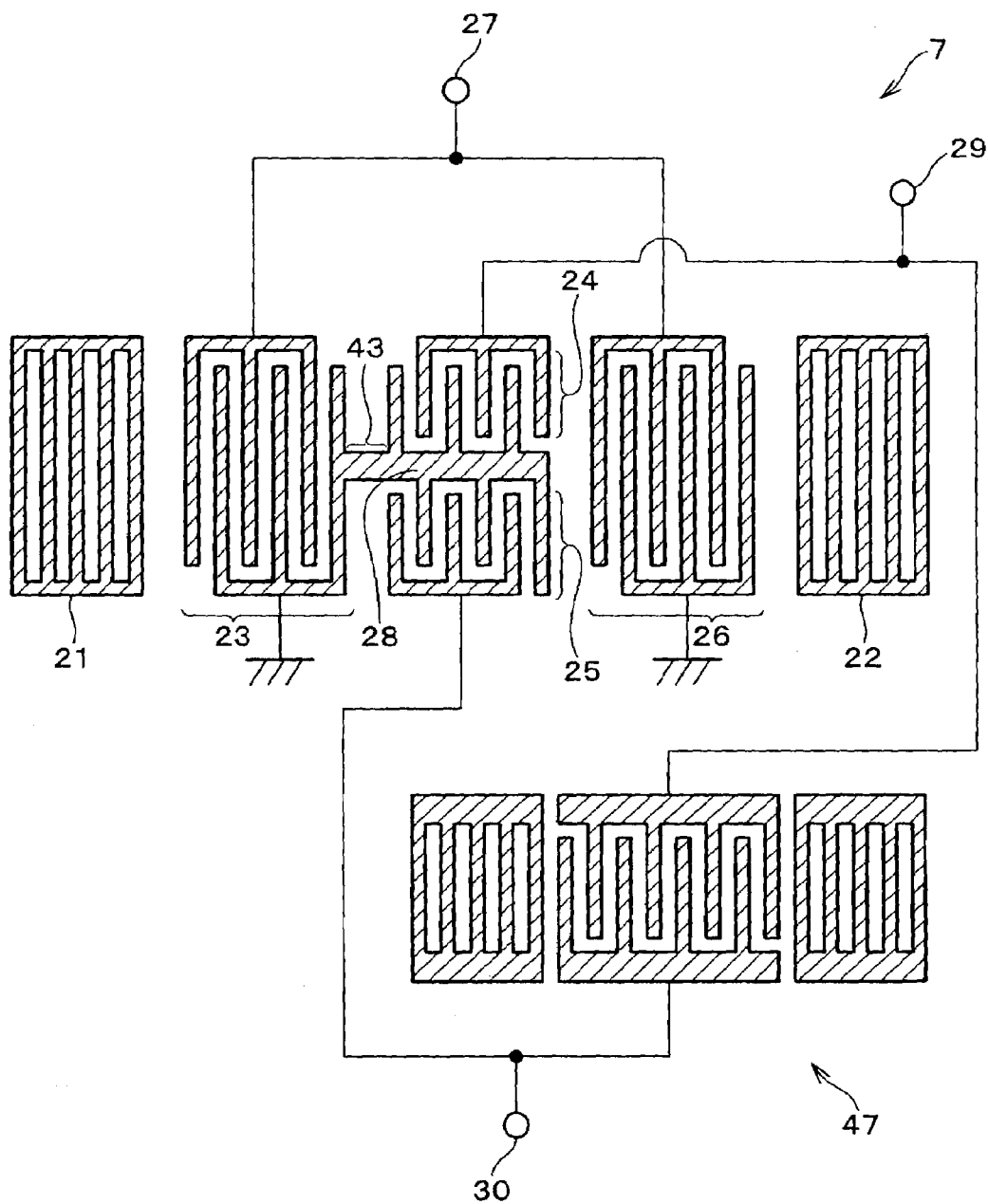
FIG. 9 is a schematic plan view showing the overall configuration of a surface acoustic wave filter according to another preferred embodiment of the present invention.

FIG. 9 shows a surface acoustic wave filter (surface acoustic wave device) 7 according to the seventh preferred embodiment of the present invention.

As shown in FIG. 9, the surface acoustic wave filter 7 is configured such that a surface acoustic wave resonator 47 is arranged substantially parallel to the IDTs 24 and 25 of the surface acoustic wave filter 3 (FIG. 5) described in the third preferred embodiment and that a balanced output is extracted from the balanced terminals 29 and 30. This surface acoustic wave resonator 47 includes reflectors on both sides of the IDT, with the two terminals of the IDT being connected to the corresponding balanced terminals 29 and 30.

Eighth Preferred Embodiment

Figure 10:
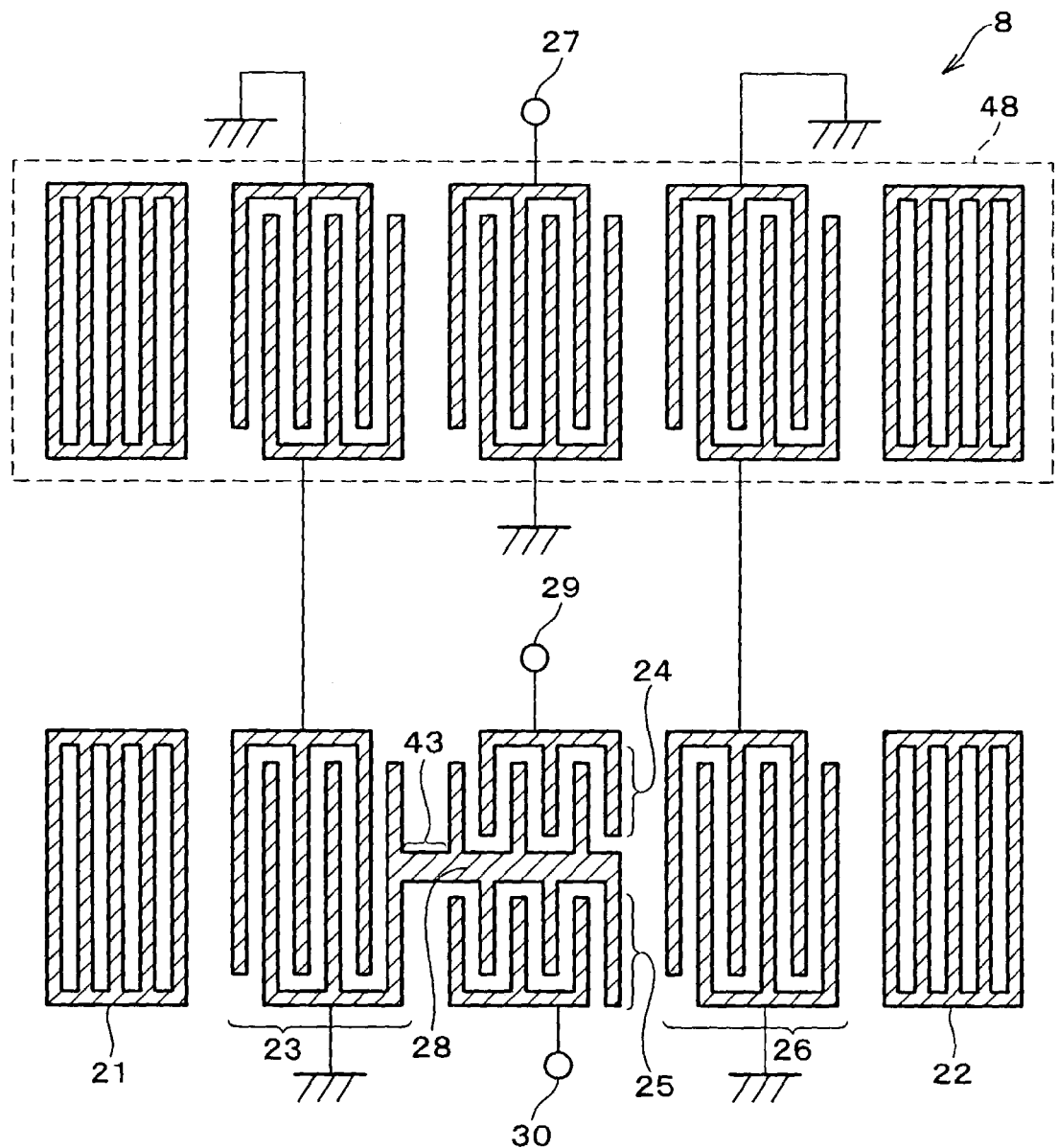
FIG. 10 is a schematic plan view showing the overall configuration of a surface acoustic wave filter according to another preferred embodiment of the present invention.

FIG. 10 shows a surface acoustic wave filter (surface acoustic wave device) 8 according to the eighth preferred embodiment of the present invention.

As shown in FIG. 10, the surface acoustic wave filter 8 is configured such that a surface acoustic wave filter 48 is cascade-connected between the IDTs 23 and 26 of the surface acoustic wave filter 3 (FIG. 5) described in the third preferred embodiment and the unbalanced terminal 27. In this surface acoustic wave filter 48, three IDTs are disposed between two reflectors along the propagation direction of surface acoustic waves. In the IDT in the center, one of the terminals thereof is grounded, and the other terminal is connected to the unbalanced terminal 27. Furthermore, in each of the IDTs on both sides of the central IDT, one of the terminals thereof is grounded, and the other terminal is connected to the terminal of the IDT 23 or 26.

Ninth Preferred Embodiment

Figure 11:
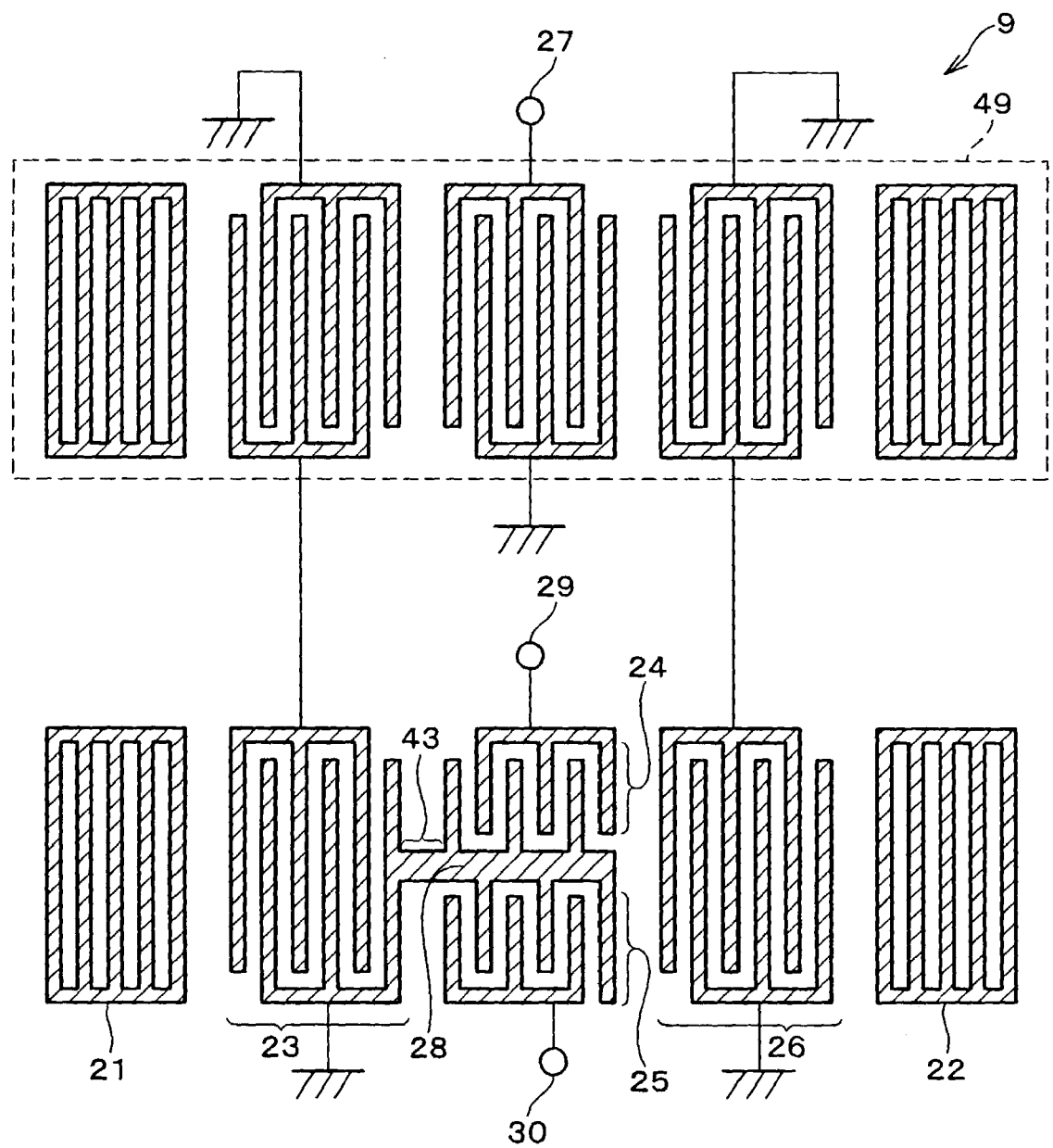
FIG. 11 is a schematic plan view showing the overall configuration of a surface acoustic wave filter according to another preferred embodiment of the present invention.

FIG. 11 shows a surface acoustic wave filter (surface acoustic wave device) 9 according to the ninth preferred embodiment of the present invention.

As shown in FIG. 11, the surface acoustic wave filter 9 differs from the surface acoustic wave filter 8 (FIG. 10) described in the eighth preferred embodiment in that the polarities of the IDTs connected to the terminals of the IDTs 23 and 26 of the surface acoustic wave filter 48 are inverted. That is, the surface acoustic wave filter 9 is configured such that a surface acoustic wave filter 49 having a polarity that is opposite to that of the surface acoustic wave filter 48 is cascade-connected between the IDTs 23 and 26 of the surface acoustic wave filter 3 (FIG. 5) described in the third preferred embodiment and the unbalanced terminal 27.

Tenth Preferred Embodiment

Figure 12:
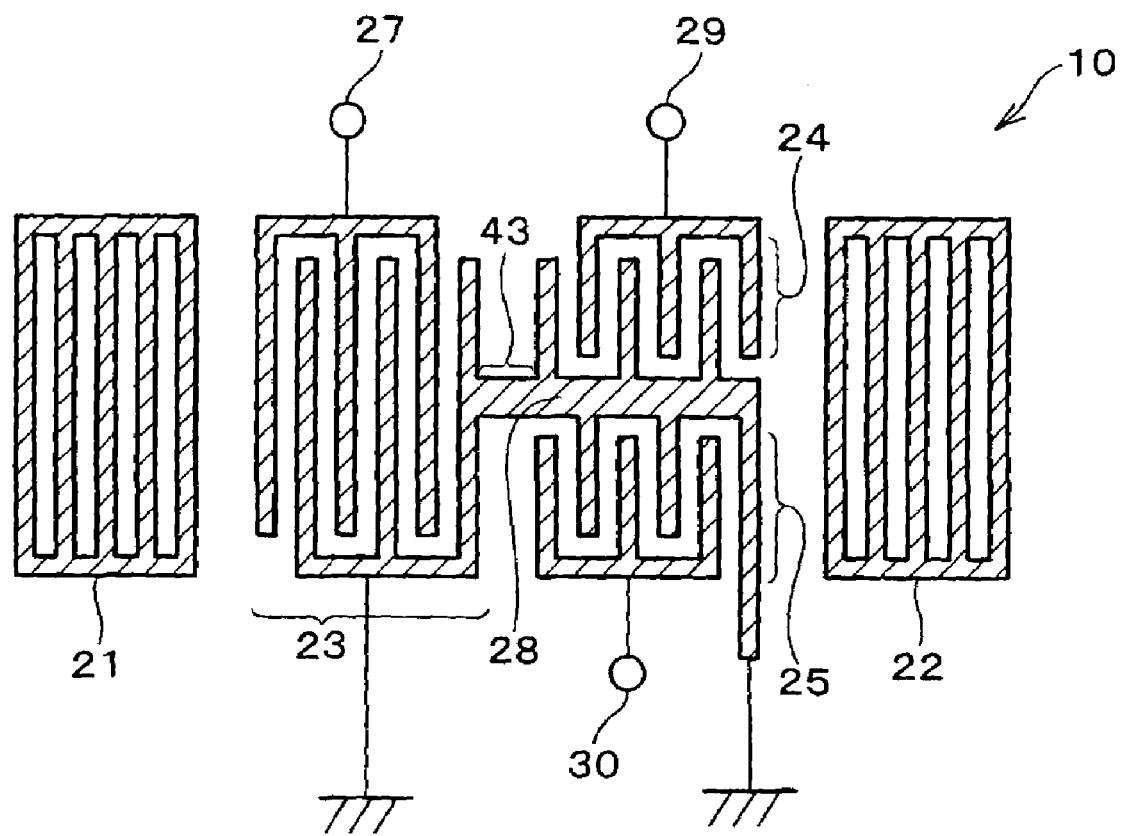
FIG. 12 is a schematic plan view showing the overall configuration of a surface-acoustic-wave filter according to another embodiment of the present invention.

FIG. 12 shows a surface acoustic wave filter (surface acoustic wave device) 10 according to the tenth preferred embodiment of the present invention.

As shown in FIG. 12, the surface acoustic wave filter 10 differs from the surface acoustic wave filter 1 (FIG. 1) described in the first preferred embodiment in that the IDT 26 is not provided. In this manner, the advantage can be obtained by only the fact that, for the IDTs 23 and 26 on both sides of the series IDTs, there is only one of them.

Eleventh Preferred Embodiment

Figure 13:
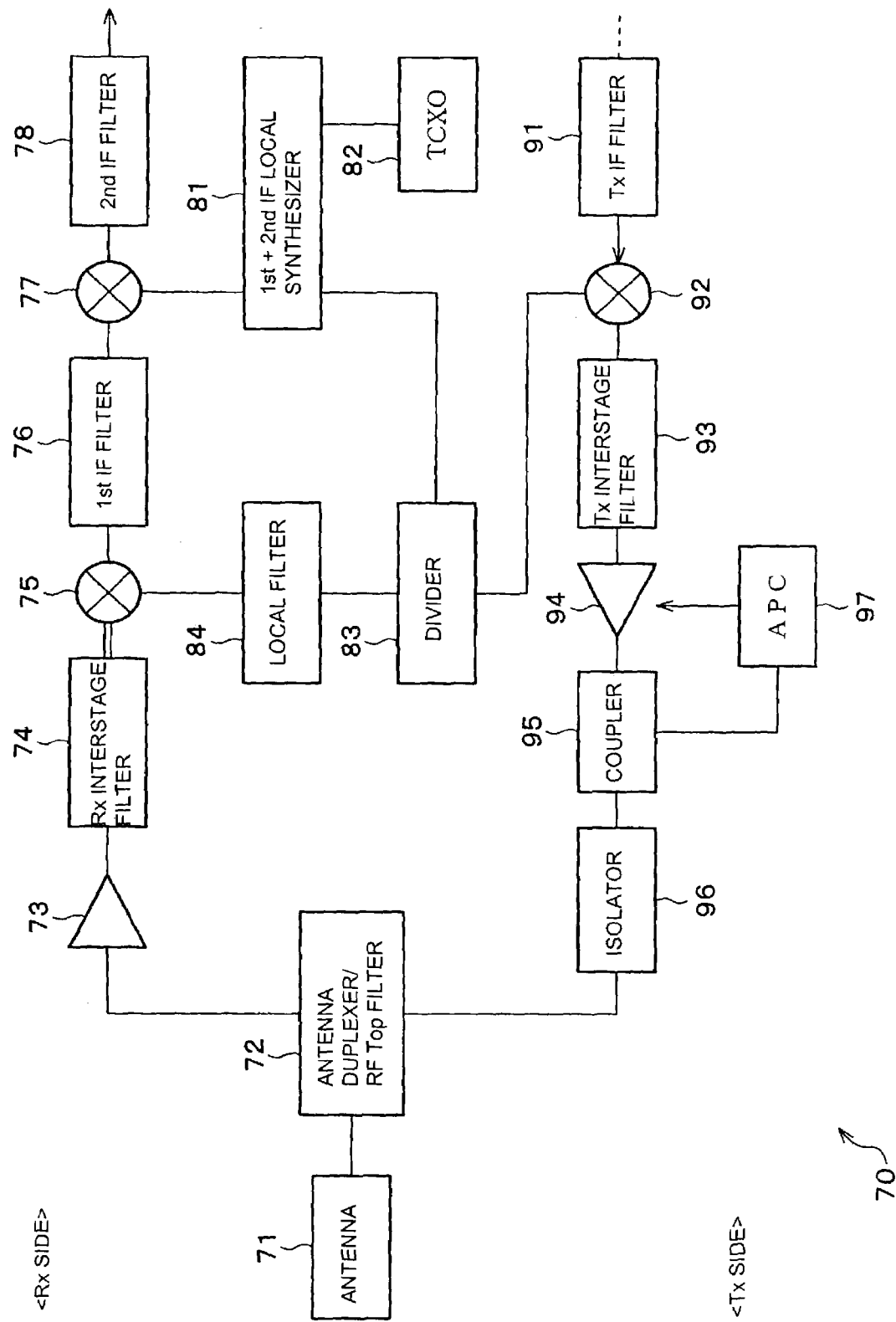
FIG. 13 is a block diagram showing the overall configuration of a communication device incorporating the surface-acoustic-wave filter shown in FIGS. 1, and 4 to 12.

Finally, with reference to FIG. 13, a communication device 70 incorporating one of the surface acoustic wave filters 1 to 10 will now be described below.

The communication device 70 preferably includes, as a receiver for performing reception, an antenna 71, an antenna duplexer section/RF Top filter 72, an amplifier 73, an Rx interstage filter 74, a mixer 75, a 1st IF filter 76, a mixer 77, a 2nd IF filter 78, a 1st+2nd local synthesizer 81, a TCXO (temperature compensated crystal oscillator) 82, a divider 83, and a local filter 84. The communication device 70, as a transceiver for performing transmission, commonly uses the antenna 71 and the antenna duplexer section/RF Top filter 72, and comprises a Tx IF filter 91, a mixer 92, a Tx interstage filter 93, an amplifier 94, a coupler 95, an isolator 96, and an APC (automatic power control) 97. It is preferable that a balanced signal be carried between the Rx interstage filter 74 and the mixer 75.

The above-described surface acoustic wave filters 1 to 10 can be suitably used in the antenna duplexer section/RF Top filter 72, the Rx interstage filter 74, the 1st IF filter 76, the Tx IF filter 91, and the Tx interstage filter 93.

As described above, the surface acoustic wave filters 1 to 10 are surface acoustic wave filters with balanced-to-unbalanced conversion functions, of a type in which balanced terminals extend from IDTs which are disposed along a direction that is substantially perpendicular to the propagation direction of surface acoustic waves (that is, IDTs which are divided in a commonly called cross-width direction) and which are connected in series. In order to remove noise coming from an abnormal electrical signal generated at the series connection point and to improve the degree of amplitude balance and the degree of phase balance, the series connection point of the series IDTs is grounded.

Therefore, the communication device 70 has superior filter characteristics by incorporating one of such surface acoustic wave filters 1 to 10.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A surface acoustic wave device comprising:
   a piezoelectric substrate;
   a pair of surface acoustic wave reflectors disposed on said piezoelectric substrate along the propagation direction of surface acoustic waves; and
   a plurality of comb-shaped electrode sections arranged between the two surface acoustic wave reflectors;
   wherein a first comb-shaped electrode section, which is one of said plurality of comb-shaped electrode sections, has two opposing electrode fingers thereof connected to corresponding balanced terminals;

divided portions of the first comb-shaped electrode section, which are divided in a direction that is substantially perpendicular to the propagation direction of surface acoustic waves, are connected to each other, and the connection point of the divided portions is grounded; and an electrode finger of the first comb-shaped electrode section extends outside of a propagation path of the surface acoustic waves to electrically connect said connection point of said divided portions of the first comb-shaped electrode section to ground.

2. A surface acoustic wave device according to claim 1, wherein, in a second comb-shaped electrode section, other than said first comb-shaped electrode section, among said plurality of comb-shaped electrode sections, one of two opposing electrode fingers is connected to an unbalanced terminal, and the other electrode finger is grounded.

3. A surface acoustic wave device according to claim 2, wherein said connection point of said first comb-shaped electrode section is electrically connected with the grounded electrode finger of said second comb-shaped electrode section.

4. A surface acoustic wave device according to claim 2, wherein one of said first comb-shaped electrode section is arranged between two of said second comb-shaped electrode sections.

5. A surface acoustic wave device according to claim 1, wherein the surface acoustic wave device has a balanced-to-unbalanced conversion function.

6. A surface acoustic wave device according to claim 1, wherein the plurality of comb-shaped electrode sections are series connected.

7. A surface acoustic wave device according to claim 6, wherein balanced terminals extend from the series-connected IDTs.

8. A surface acoustic wave device according to claim 7, further comprising a common electrode located at a series connection point of the series-connected IDTs from which balanced terminals extend.

9. A communication device comprising a surface acoustic wave device according to claim 1.

10. A surface acoustic wave device comprising:

a piezoelectric substrate;

a plurality of series-connected IDTs disposed along a propagation direction of surface acoustic waves on said piezoelectric substrate;

balanced terminals extending from the series-connected IDTs disposed in a direction that is substantially perpendicular to the propagation direction of surface acoustic waves; wherein a series connection point of the series-connected IDTs is grounded;

on a side of a first of the plurality of series-connected IDTs, an electrode finger, which defines a grounding line, is provided and extends outside a propagation path of the surface acoustic waves, and the end portion of the electrode finger is grounded.

11. A surface acoustic wave device according to claim 10, wherein the surface acoustic wave device has a balanced-to-unbalanced conversion function.

12. A surface acoustic wave device according to claim 10, wherein the plurality of series-connected IDTs includes first and second series-connected IDTs, the first and second series-connected IDTs are arranged so as to approximately divide the width of the propagation path of the surface acoustic waves into two portions.

13. A surface acoustic wave device according to claim 10, wherein terminals of the first and second series-connected IDTs are integrally provided to define the common electrode.

14. A communication device comprising a surface acoustic wave device according to claim 10.

* * * * *